United States Patent
Holmberg et al.

(10) Patent No.: US 6,178,318 B1
(45) Date of Patent: *Jan. 23, 2001

(54) SHIELDING HOUSING AND A METHOD OF PRODUCING A SHIELDING HOUSING

(75) Inventors: Per Holmberg, Dalby; Mats Larsson, Malmö, both of (SE)

(73) Assignee: Telefonaktiebolaget L M Ericsson, Stockholm (SE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/060,111

(22) Filed: Apr. 15, 1998

(30) Foreign Application Priority Data

Apr. 16, 1997 (SE) ................................... 9701417

(51) Int. Cl.[7] .................................................. H04Q 7/20
(52) U.S. Cl. ..................... 455/300; 361/818; 361/816; 174/35 R; 174/820; 455/90
(58) Field of Search ..................... 455/300, 575, 455/90, 117, 128, 301; 343/702, 841, 714, 872; 361/752, 818, 816, 799, 800, 761, 762, 395, 820; 439/63, 916; 174/35 R, 35 GS, 35 GC, 35 MS; 379/328, 330, 331

(56) References Cited

U.S. PATENT DOCUMENTS

| 5,150,282 | | 9/1992 | Tomura et al. . | |
|---|---|---|---|---|
| 5,177,324 | * | 1/1993 | Carr et al. | 361/401 |
| 5,235,492 | | 8/1993 | Hunbert et al. . | |
| 5,335,147 | * | 8/1994 | Weber | 361/818 |
| 5,436,803 | * | 7/1995 | Annis et al. | 361/818 |
| 5,687,470 | * | 11/1997 | Halttunen et al. | 29/592.1 |
| 5,763,824 | * | 6/1998 | King et al. | 174/35 R |
| 5,832,371 | * | 11/1998 | Thornton | 455/90 |
| 5,872,331 | * | 2/1999 | Ando et al. | 174/35 R |
| 5,874,920 | * | 2/1999 | Araki et al. | 343/702 |
| 5,946,199 | * | 8/1999 | Matsuzaki | 361/818 |

FOREIGN PATENT DOCUMENTS

| 07326880 | 12/1995 | (JP) . |
|---|---|---|
| 08070195 | 3/1996 | (JP) . |
| 08102593 | 4/1996 | (JP) . |
| 08107286 | 4/1996 | (JP) . |
| 08316677 | 11/1996 | (JP) . |

* cited by examiner

Primary Examiner—Nay Maung
Assistant Examiner—Jean Gelin
(74) Attorney, Agent, or Firm—Burns, Doane, Swecker & Mathis, L.L.P.

(57) ABSTRACT

A shielding housing for electrically shielding at least one component on a printed circuit board includes a layer of a non-shielding material having at least one cavity for receiving the component. An elastic gasket is provided on the rim of the cavity. A layer of an electrically shielding material covers the gasket as well as one or both surfaces of the layer of a non-shielding material. In operation, the shielding housing is pressed with its gasket against a conductor located on the printed circuit board around the component to be shielded.

7 Claims, 1 Drawing Sheet

SHIELDING HOUSING AND A METHOD OF PRODUCING A SHIELDING HOUSING

TECHNICAL FIELD

The invention relates to a shielding housing for electrically shielding one or more components on a printed circuit board as well as to a method of producing such a shielding housing.

BACKGROUND

To prevent components in electronic equipment, e.g. mobile phones, from transmitting unwanted high-frequency signals that may interfere with other electronic equipment or vice versa, i.e. to prevent other electronic equipment from interfering with components in mobile phones, such components have to be electrically shielded. Moreover, such a shielding is necessary in order for the equipment to comply with electromagnetic compatibility (EMC) requirements.

Today, soldered shielding cans or housings are used to shield critical components on a printed circuit board. The shielding cans are soldered to conductors on the printed circuit board to cover the critical components.

However, it is often necessary to test the components located under the shielding cans. Such tests have to be carried out both during production stages and at after-sales services.

Shielding cans soldered to printed circuit boards are difficult to remove and replace in connection with such tests and services.

SUMMARY

The object of the invention is to bring about a shielding housing which is easy to mount and dismount, and which is inexpensive to produce and inexpensive to replace.

This is attained in that the shielding housing in accordance with the invention, is made of an inexpensive non-shielding material or semi-shielding/semi-conducting material, e.g. a plastic material, with or without conductive fillers such as graphite and metal fibers, and has at least one cavity for receiving the components to be shielded. Along the rim of the cavity, an elastic gasket is provided. The gasket as well as the inner and/or outer surface of the housing is covered by an electrically shielding material, e.g. a conductive paint, a metallization or a metal foil. The shielding housing according to the invention is intended to be pressed, i.e. not soldered, with its gasket against a conductor which is provided around the components to be shielded.

Hereby, the shielding housing will be easy to mount and dismount. Since the shielding housing according to the invention is made of inexpensive material, it is inexpensive to produce.

BRIEF DESCRIPTION OF THE DRAWINGS

The invention will be described more in detail below with reference to the appended drawings in which.

DETAILED EMBODIMENTS

It should be pointed out that, in order to better illustrate the invention, the dimensions of layers and other elements of the different embodiments shown in FIGS. 1–5, are greatly exaggerated.

Figure 1:
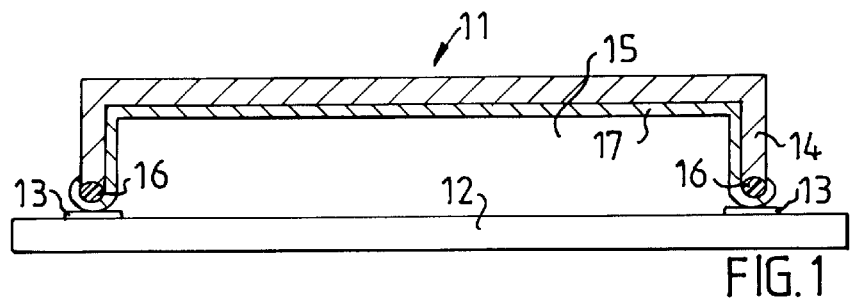
FIGS. 1–5 are schematical cross-sectional views of five different embodiments of a shielding housing according to the invention.

On the drawing, FIG. 1 shows a first embodiment of a shielding housing in accordance with the invention, generally denoted 11, for shielding one or more components (not shown) on a printed circuit board 12. On the printed circuit board, in a manner known per se, a conductor 13 surrounds the components to be shielded by means of the shielding housing 11.

The housing 11 as shown on the drawing, comprises a layer 14 of an inexpensive, non-shielding material, e.g. a plastic material, which is somewhat rigid. In the embodiment according to FIG. 1, the layer 14 is formed to define a single cavity 15 for receiving the components (not shown) to be shielded on the board 12.

Along the rim of the housing 11, i.e. along the rim of the cavity 15 in the embodiment shown, an elastic gasket 16 has been deposited. The gasket 16 may be made of any suitable non-conductive, semi-shielding/semi-conductive or conductive elastic material, e.g. a plastic material such as silicone, silicone rubber, epoxy, polyurethane or thermoplastic elastomeres.

The gasket 16 may be deposited on the rim of the cavity 15 e.g. by injection moulding, gluing, dispensation or any other suitable process.

In accordance with the invention, in the embodiment shown, the gasket 16 and the inner surface of the layer 14, i.e. the inside of the cavity 15, are covered by a layer 17 of an electrically shielding material, e.g. a conductive paint, a metallization or a metal foil.

Instead of being soldered to the conductor 13 on the printed circuit board 12, in accordance with the invention, the housing 11 is supposed to be pressed with its gasket 16 against the conductor 13 by means of e.g. at least one screw (not shown) or at least one clip (not shown). In case of a mobile phone, the housing 11 may be pressed against the printed circuit board by means of e.g. a covering lid (not shown) of the mobile phone.

Figure 2:
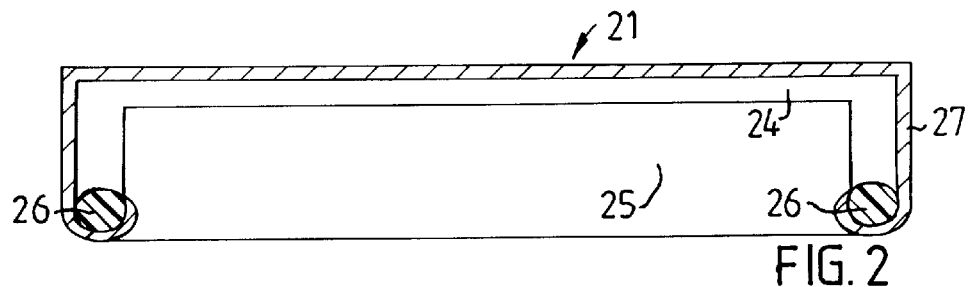

FIG. 2 shows a second embodiment of a shielding housing 21 according to the invention. As in the embodiment in FIG. 1, the housing 21 according to FIG. 2 comprises a layer 24 of an inexpensive, non-shielding material, which is formed to define a single cavity 25 for receiving the components (not shown) to be shielded on the printed circuit board (not shown in FIG. 2). Along the rim of the housing 21, i.e. along the rim of the cavity 25 in the embodiment shown, an elastic gasket 26 has been deposited. The embodiment according to FIG. 2 differs from the embodiment according to FIG. 1 merely in that the gasket 26 and the outer surface of the layer 24, i.e. the outside of the cavity 25 instead of its inside, are covered by a layer 27 of an electrically shielding material of the same type as in FIG. 1.

It is to be understood that, from a production point of view, it may be convenient, in a manner not illustrated, to cover both the inside and the outside of a housing in accordance with FIGS. 1 and 2, as well as the gasket with a layer of an electrically shielding material.

Figure 3:
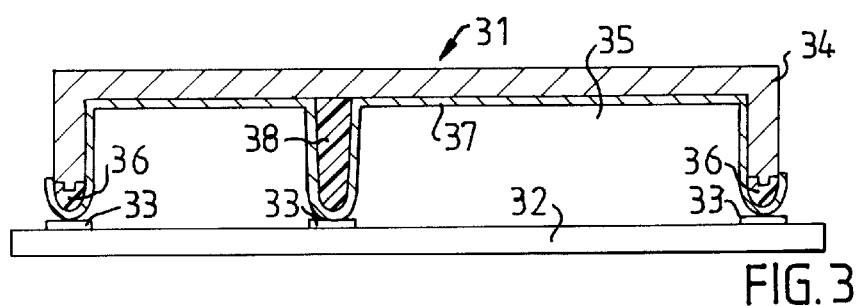

FIG. 3 illustrates a third embodiment of a shielding housing 31 according to the invention. The shielding housing 31 resembles the shielding housing 11 in FIG. 1 but is provided with two cavities 35 for shielding two different sets of components (not shown) on a printed circuit board 32. The cavities 35 are separated by an elastic partition wall 38 formed from the same material and in the same process as gaskets 36 along the outer rim of the housing 31, i.e. along the rim of a layer 34 of an inexpensive, non-shielding material. In the embodiment according to FIG. 3, a layer 37 of a shielding material is deposited on the gasket 36, on the inside of the housing 31, and on the the sides and the lower rim of the partition wall 38. As a consequence, the printed circuit board 32 has to be provided with conductors 33 cooperating with not just the gasket 36 but also with the lower rim of the partition wall 38.

Figure 4:
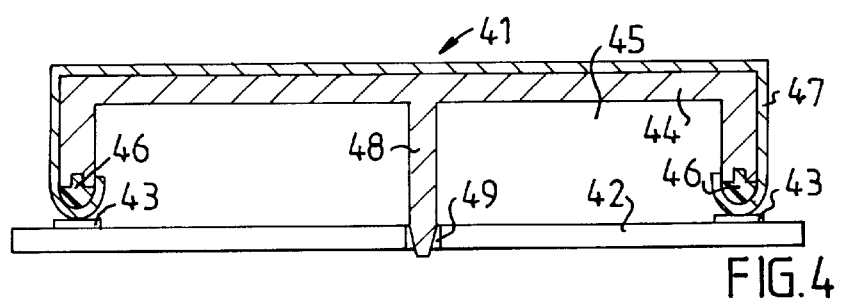

FIG. 4 illustrates a fourth embodiment of a shielding housing 41 according to the invention. The embodiment in FIG. 4 resembles the embodiment in FIG. 2, but in accordance with the invention, the housing 41 is provided with a guiding pin 48 which is adapted to cooperate with a corresponding hole 49 in a printed circuit board 42 to fix the location of the housing 41 on the board 42. The guiding pin 48 is made intgral with the layer 44 of a non-shielding material in the embodiment illustrated in FIG. 4. As in the embodiment in FIG. 2, a layer 47 of a shielding material is deposited on the gasket 46 and the outside of the housing 41.

Figure 5:
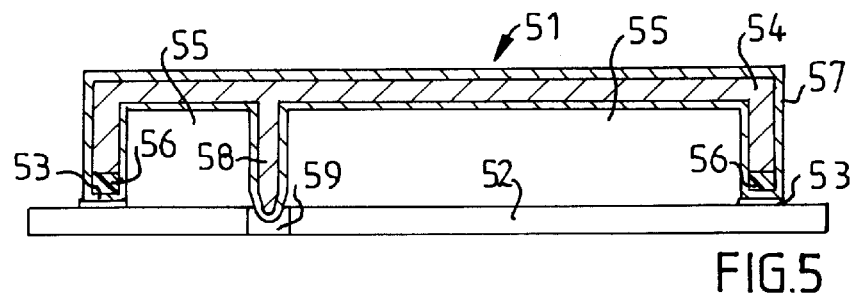

FIG. 5 is a fifth embodiment of a shielding housing 51 according to the invention. The embodiment in FIG. 5 resembles the embodiment in FIG. 4. The only difference between these embodiments is that a layer 57 of shielding material covers a gasket 56 at the rim of the housing 51 as well as both the inside and the outside of the housing 51 and all of a guiding pin 58 cooperating with a corresponding hole 59 in a printed circuit board 52. As in the other embodiments, the housing 51 is supposed to be pressed with its gasket 56 against a conductor 53 on the printed circuit board 52.

Thus, since the shielding housing according to the invention is not intended to be soldered to a printed circuit board, it will be easy to remove in order to test the components that are located thereunder. After such a test, it will be equally easy to put the shielding housing back in place.

By using inexpensive material, the shielding housing according to the invention will also be inexpensive to produce. Should the shielding housing have to be replaced, such a replacement will consequently not involve any high costs.

What is claimed is:

1. A shielding housing for electrically shielding at least one component on a printed circuit board, the housing comprising a layer of a non-shielding material having at least one cavity for receiving said at least one component, and an elastic gasket provided on the rim of said at least one cavity, the elastic gasket having an inner surface facing the cavity and an outer surface facing the outside of the housing, wherein a continuous layer of an electrically shielding material covers the inner and outer surfaces of the gasket as well as one or both surfaces of said layer of a nonshielding material, the shielding housing being pressed with the elastic gasket, covered by said layer of an electrically shielding material, against a conductor located on the printed circuit board, around said at least one component to be shielded.

2. The housing according to claim 1, wherein at least one guiding pin cooperates with a corresponding hole in the printed circuit board to fix the location of the shielding housing on the printed circuit board.

3. The housing according to claim 2, wherein said at least one guiding pin is formed integrally with said layer of a non-shielding material.

4. The housing according to claim 1, wherein at least one screw or clip presses the shielding housing with its gasket against said conductor on the printed circuit board.

5. The housing according to claim 1, wherein the material of the elastic gasket is selected from a group comprising non-conductive, semi-shielding/semi-conducting and conductive materials.

6. A method of producing a shielding housing for electrically shielding at least one component on a printed circuit board, the method comprising forming at least one cavity in a layer of a non-shielding material for receiving said at least one component, and depositing a gasket of an elastic material on the rim of said at least one cavity, the elastic gasket having an inner surface facing the cavity and an outer surface facing the outside of the housing, wherein a continuous layer of an electrically shielding material is deposited on the inner and outer surface of the gasket as well as on one or both surfaces of said layer of a nonshielding material, the shielding housing being pressed with its gasket, covered by said layer of an electrically shielding material, against a conductor on the printed circuit board, surrounding said at least one component to be shielded.

7. A mobile phone comprising a printed circuit board with at least one component electrically shielded by a shielding having at least one cavity for receiving said at least one component, am elastic gasket being provided on the rim of said at least one cavity, the elastic gasket having an inner surface facing the cavity and an outer surface facing the outside of the housing. wherein the shielding housing comprises a layer of a non-shielding material and a continuous layer of an electrically shielding material covering the inner and outer surfaces of the gasket as well as one or both surfaces of said layer of a non-shielding material, the shielding housing being pressed with its gasket, covered by said layer of an electrically shielding material, against the conductor on the printed circuit board.

* * * * *